United States Patent
Totani

(10) Patent No.: US 9,177,948 B2
(45) Date of Patent: Nov. 3, 2015

(54) SWITCHING ELEMENT UNIT

(71) Applicant: AISIN AW CO., LTD., Anjo-shi, Aichi-ken (JP)

(72) Inventor: Hirohisa Totani, Yokkaichi (JP)

(73) Assignee: AISIN AW CO., LTD., Anjo (JP)

( * ) Notice: Subject to any disclaimer, the term of this patent is extended or adjusted under 35 U.S.C. 154(b) by 0 days.

(21) Appl. No.: 14/359,486

(22) PCT Filed: Jan. 29, 2013

(86) PCT No.: PCT/JP2013/052429
§ 371 (c)(1),
(2) Date: May 20, 2014

(87) PCT Pub. No.: WO2013/115395
PCT Pub. Date: Aug. 8, 2013

(65) Prior Publication Data
US 2014/0264519 A1  Sep. 18, 2014

(30) Foreign Application Priority Data

Jan. 31, 2012 (JP) .................................. 2012-019132
Nov. 30, 2012 (JP) .................................. 2012-263052

(51) Int. Cl.
*H01L 23/48* (2006.01)
*H01L 27/02* (2006.01)
(Continued)

(52) U.S. Cl.
CPC .......... *H01L 27/0207* (2013.01); *H01L 23/642* (2013.01); *H01L 24/40* (2013.01); *H01L 25/16* (2013.01); *H01L 25/18* (2013.01); *H01L 27/0629* (2013.01); *H02M 1/126* (2013.01); *H02M 7/003* (2013.01); *H01L 24/32* (2013.01); *H01L 25/072* (2013.01); *H01L 2224/32225* (2013.01); *H01L 2224/40137* (2013.01);
(Continued)

(58) Field of Classification Search
CPC ........... H01L 2224/32225; H01L 2224/40137; H01L 2224/73263
See application file for complete search history.

(56) References Cited

U.S. PATENT DOCUMENTS 5,095,402 A * 3/1992 Hernandez et al. ........ 361/306.2
6,373,127 B1 * 4/2002 Baudouin et al. ............. 257/676
(Continued)

FOREIGN PATENT DOCUMENTS

JP  S59-61917 A  4/1984
JP  A-08-181445  7/1996
(Continued)

OTHER PUBLICATIONS

May 15, 2013 International Search Report issued in International Application No. PCT/JP2013/052429.

*Primary Examiner* — John C Ingham
(74) *Attorney, Agent, or Firm* — Oliff PLC

(57) ABSTRACT

A switching element unit comprising a switching element and a smoothing capacitor that suppresses variation in DC voltage to be supplied to the switching element. An element mounting surface may be formed in an outer surface of the smoothing capacitor and may be formed integrally with a dielectric portion interposed between electrodes of the smoothing capacitor. A capacitor connection electrode as an electrode may be electrically connected to a terminal of the smoothing capacitor formed on the element mounting surface, and the switching element is placed on the element mounting surface such that a terminal of the switching element is electrically connected to the capacitor connection electrode.

16 Claims, 7 Drawing Sheets

(51) Int. Cl.
   *H02M 7/00* (2006.01)
   *H02M 1/12* (2006.01)
   *H01L 23/64* (2006.01)
   *H01L 25/16* (2006.01)
   *H01L 25/18* (2006.01)
   *H01L 27/06* (2006.01)
   *H01L 25/07* (2006.01)
   *H01L 23/00* (2006.01)

(52) U.S. Cl.
   CPC ............. *H01L2224/40225* (2013.01); *H01L 2224/73263* (2013.01); *H01L 2924/1305* (2013.01); *H01L 2924/1306* (2013.01); *H01L 2924/13055* (2013.01); *H01L 2924/13091* (2013.01)

(56) References Cited

U.S. PATENT DOCUMENTS

| | | | | |
|---|---|---|---|---|
| 6,642,576 | B1 * | 11/2003 | Shirasawa et al. | 257/328 |
| 6,940,164 | B1 * | 9/2005 | Yoshimatsu et al. | 257/725 |
| 8,253,241 | B2 * | 8/2012 | Landau et al. | 257/723 |
| 2004/0228094 | A1 | 11/2004 | Ahmed et al. | |
| 2004/0230847 | A1 | 11/2004 | Patwardhan et al. | |
| 2006/0119512 | A1 | 6/2006 | Yoshimatsu et al. | |

FOREIGN PATENT DOCUMENTS

| | | |
|---|---|---|
| JP | A-11-178353 | 7/1999 |
| JP | 2002-176128 A | 6/2002 |
| JP | 2005-072147 A | 3/2005 |
| JP | 2006-190972 A | 7/2006 |
| JP | 2009-100514 A | 5/2009 |
| WO | WO 2006/101150 A2 | 9/2006 |

* cited by examiner

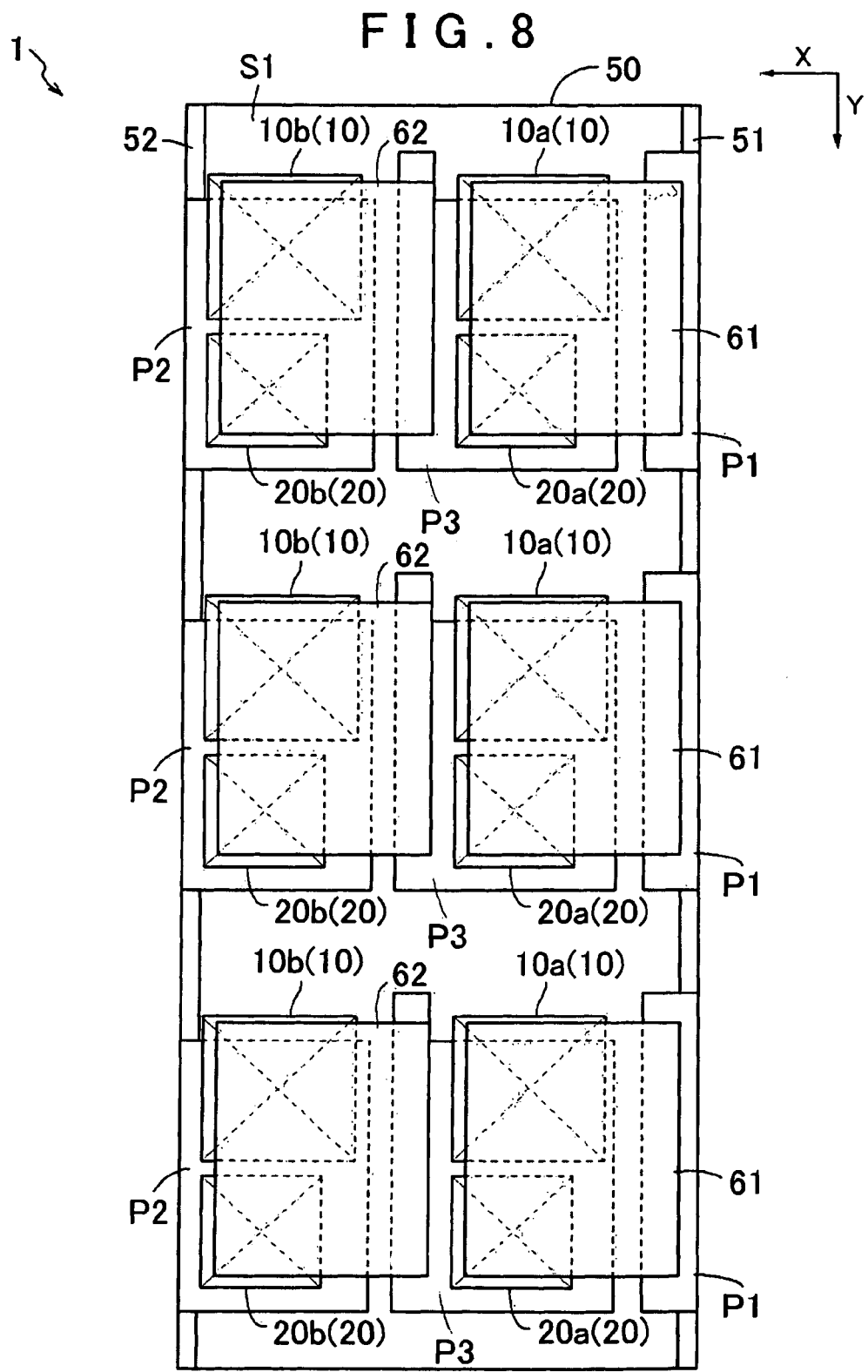

US 9,177,948 B2

SWITCHING ELEMENT UNIT

INCORPORATION BY REFERENCE

The disclosure of Japanese Patent Application No. 2012-019132 filed on Jan. 31, 2012 and Japanese Patent Application No. 2012-263052 filed on Nov. 30, 2012 including the specification, drawings and abstract is incorporated herein by reference in its entirety.

BACKGROUND OF THE INVENTION

The present invention relates to switching element units including a switching element.

DESCRIPTION OF THE RELATED ART

In semiconductor integrated circuits, it is necessary to prevent malfunction due to switching noise. Regarding prevention of such malfunction, there is a technique described in, e.g., Japanese Patent Application Publication No. H08-181445 (JP H08-181445 A) (paragraphs 0016 to 0017, FIG. 1, etc.). In the section "Description of the Related Art," description is given by showing the reference characters of JP H08-181445 A in parentheses "[ ]". FIG. 1 of JP H08-181445 A shows a configuration in which an LSI chip [11] is placed on a printed wiring board [14] with a ceramic multilayer substrate [20] interposed therebetween, and a capacitor portion [23] is contained in the ceramic multilayer substrate [20]. Thus, as described in paragraphs 0016 to 0017 in this document, switching noise is filtered by the capacitor portion [23], and malfunction of the LSI chip [11] can be prevented.

Some switching element units having a switching element include a smoothing capacitor that suppresses variation in direct current (DC) voltage to be supplied to the switching element. However, the capacitor portion [23] described in JP H08-181445 A is provided in order to prevent malfunction of the LSI chip [11], and JP H08-181445 A does not mention a smoothing capacitor.

SUMMARY OF THE INVENTION

It is desired to implement switching element units capable of including a smoothing capacitor while reducing the overall size of the unit.

A switching element unit according to an aspect of the present invention includes: a switching element; and a smoothing capacitor that suppresses variation in DC voltage to be supplied to the switching element. In the switching element unit, an element mounting surface formed in an outer surface of the smoothing capacitor is formed integrally with a dielectric portion interposed between electrodes of the smoothing capacitor, a capacitor connection electrode as an electrode that is electrically connected to a terminal of the smoothing capacitor is formed on the element mounting surface, and the switching element is placed on the element mounting surface such that a terminal of the switching element is electrically connected to the capacitor connection electrode.

According to the aspect, the length of an electric connection path that electrically connects the switching element and the smoothing capacitor can be reduced as compared to the case where the switching element is placed to be separated from the smoothing capacitor. This can reduce inductance of the electric connection path, and can reduce a surge voltage (a temporary voltage increase) associated with a switching operation of the switching element. As a result, the amount of heat that is generated by the switching element can be reduced according to the reduction in surge voltage, and a cooling mechanism required for heat dissipation can be simplified, whereby the overall size of the unit can be reduced.

Since breakdown voltage performance required for the switching element and peripheral components can be reduced according to the reduction in surge voltage, the overall cost of the unit can be reduced.

According to the aspect, since the element mounting surface is formed integrally with the dielectric portion of the smoothing capacitor, the element mounting surface can be formed simultaneously with the dielectric portion, whereby the manufacturing process of the switching element unit can be simplified.

The switching element unit may be configured such that the switching element has an opposing mounting surface facing the element mounting surface, and the switching element is placed on the element mounting surface so that the opposing mounting surface contacts the element mounting surface directly or via a bonding member.

According to this configuration, the length of the electric connection path that electrically connects the switching element and the smoothing capacitor can be easily reduced. Since the switching element can be made to be in surface contact with the element mounting surface, stable placement of the switching element can be achieved.

In the configuration in which the opposing mounting surface contacts the element mounting surface directly or via a bonding member as described above, the switching element unit may be configured such that the switching element includes on the opposing mounting surface a main terminal that is electrically connected to a supply source of the DC voltage, and the main terminal is electrically connected to the capacitor connection electrode.

According to this configuration, the electric connection structure between the main terminal of the switching element and the capacitor connection electrode can be simplified.

In the switching element unit of each of the above configurations, the switching element unit may be configured such that the switching element has an opposing mounting surface facing the element mounting surface, a control terminal that controls the switching element is formed on the opposing mounting surface, and a control electrode that is electrically connected to the control terminal is formed on the element mounting surface.

According to this configuration, since the control electrode is formed on the element mounting surface, a control signal path between the control terminal and a control unit that controls the switching element can be formed by effectively using the element mounting surface on which the switching element is placed. This can reduce the space required to form this path. Moreover, since the control terminal is formed on the opposing mounting surface, the electric connection structure between the control terminal and the control electrode can be simplified. In the case where a control resistor is placed on the element mounting surface, the length of an electric connection path between the control terminal and the control resistor can be reduced, and the surge voltage can be reduced.

The switching element unit may be configured such that the switching element unit further includes a diode element that is electrically connected in parallel to the switching element, and the diode element is placed on the element mounting surface.

According to this configuration, the electric connection structure that electrically connects the switching element and the diode electrode in parallel can be simplified as compared to the case where the diode element is placed on a surface different from the element mounting surface or in a member different from the smoothing capacitor. This facilitates reduction in overall size of the unit.

In the configuration in which the diode element is placed on the element mounting surface as described above, the switching element unit may be configured such that the opposing mounting surface facing the element mounting surface of the switching element is a first opposing mounting surface, the diode element includes on a second opposing mounting surface facing the element mounting surface a terminal that is electrically connected to the capacitor connection electrode, and the diode element is placed on the element mounting surface so that the second opposing mounting surface contacts the element mounting surface directly or via a bonding member.

According to this configuration, the electric connection structure that electrically connects the diode element and the smoothing capacitor can be simplified. Since the diode element can be made to be in surface contact with the element mounting surface, stable placement of the diode element can be achieved.

In the switching element unit of each of the above configurations, the switching element unit may be configured such that two of the switching elements that are electrically connected in series to each other to form a switching element series circuit are placed on the element mounting surface, and a first capacitor connection electrode that electrically connects a first end of the switching element series circuit and a first terminal of the smoothing capacitor, a second capacitor connection electrode that electrically connects a second end of the switching element series circuit and a second terminal of the smoothing capacitor, and an inter-element connection electrode that electrically connects the two switching elements are formed on the element mounting surface.

According to this configuration, in the case where switching elements having the same configuration are used as the two switching elements forming the switching element series circuit, the two switching elements can be placed in the same direction on the element mounting surface. This can simplify the manufacturing process as compared to the case where the two switching elements need be placed in different directions from each other on the element mounting surface.

In the configuration in which the first capacitor connection electrode, the second capacitor connection electrode, and the inter-element connection electrode are formed on the element mounting surface as described above, the switching element unit may be configured such that the inter-element connection electrode is placed between the first capacitor connection electrode and the second capacitor connection electrode in an extending direction of the element mounting surface.

According to this configuration, the order in which the first capacitor connection electrode, the second capacitor connection electrode, and the inter-element connection electrodes are arranged in the extending direction of the element mounting surface is the same as the order in which the electrodes are arranged in the electric path between the first end and the second end of the switching element series circuit. This can reduce a required insulation distance between the electrodes, and can simplify an interconnect structure provided in addition to the electrodes.

The switching element unit may be configured such that, of the two switching elements forming the switching element series circuit, the switching element that is placed on a first end side is a first switching element, and the switching element that is placed on a second end side is a second switching element, the switching element unit_further includes: a first connection member that electrically connects the first capacitor connection electrode and the first switching element; and a second connection member that electrically connects the inter-element connection electrode and the second switching element, the first connection member has a first portion that contacts the first capacitor connection electrode directly or via a bonding member, and a second portion that contacts the first switching element directly or via a bonding member, and the second connection member has a first portion that contacts the inter-element connection electrode directly or via a bonding member, and a second portion that contacts the second switching element directly or via a bonding member.

According to this configuration, the configuration of the first connection member and the second connection member can be simplified, and the length of an electric connection path that electrically connects the first capacitor connection electrode and the first switching element and the length of an electric connection path that electrically connects the inter-element connection electrode and the second switching element can be easily reduced.

In the switching element unit of each of the above configurations, the switching element unit may be configured such that six of the switching elements forming a DC-AC conversion circuit that converts a DC voltage to an AC voltage are placed on the element mounting surface.

According to this configuration, reduction in overall size of the unit and reduction in overall cost of the unit can be facilitated in the case where the switching element unit according to the present invention is applied to the DC-AC conversion circuit that converts a DC voltage to a three-phase AC voltage.

The switching element unit may be configured such that the dielectric portion is made of a ceramic material.

According to this configuration, impulse withstand voltage performance can be improved.

BRIEF DESCRIPTION OF THE DRAWINGS

FIG. 8 is a plan view of a switching element unit according to another embodiment of the present invention.

DETAILED DESCRIPTION OF THE EMBODIMENTS

An embodiment of the present invention will be described with reference to the accompanying drawings. The embodiment is described with respect to an example in which a switching element unit according to the present invention is applied to an inverter circuit 91 (see FIG. 7) that controls a rotating electrical machine 2. That is, in the present embodiment, a switching element 10 that forms a switching element unit 1 is an electronic element that carries out power conversion between direct current (DC) power to alternating current (AC) power.

Figure 4:
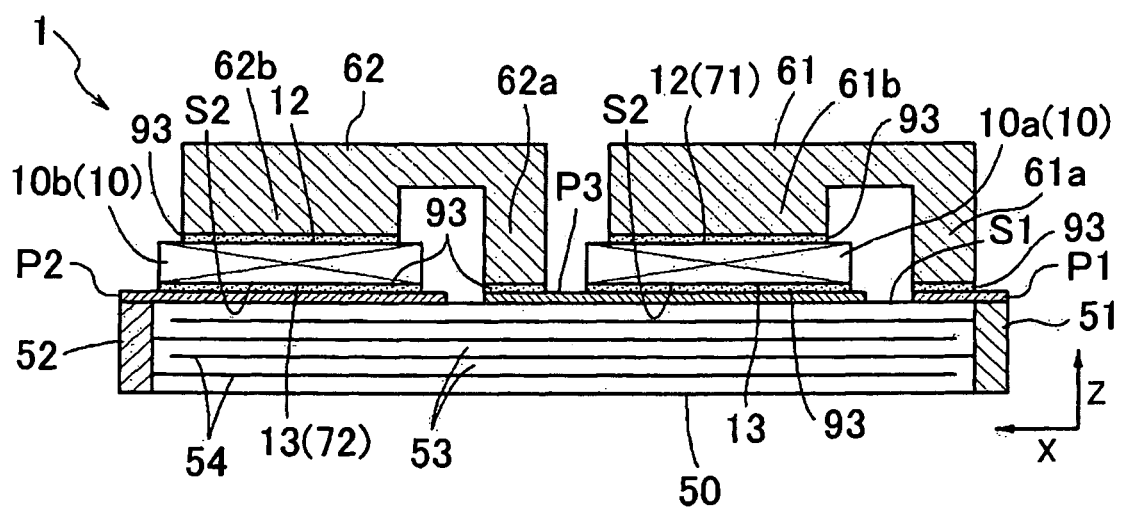
FIG. 4 is a sectional view taken along line IV-IV in FIG. 3.

In the following description, "upper" means the Z direction in FIG. 1 and "lower" means the −Z direction in FIG. 1 unless otherwise specified. As shown in FIGS. 2 and 4, the Z direction is the direction from an element mounting surface S1 toward the switching element 10 placed thereon along a direction perpendicular to the element mounting surface S1 (that is, the direction of a normal vector outward from the element mounting surface S1). The X direction is the direction from a first terminal 51 toward a second terminal 52 of a first smoothing capacitor 50 in a plane parallel to the element mounting surface S1. The Y direction is defined so that the X direction, the Y direction, and the Z direction form a right-handed orthogonal coordinate system. That is, the X and Y directions perpendicular to each other are the directions parallel to the element mounting surface S1. In the present embodiment, the inverter circuit 91 corresponds to the "DC-AC conversion circuit" in the present invention.

1. Schematic Configuration of Switching Element Unit

Figure 1:
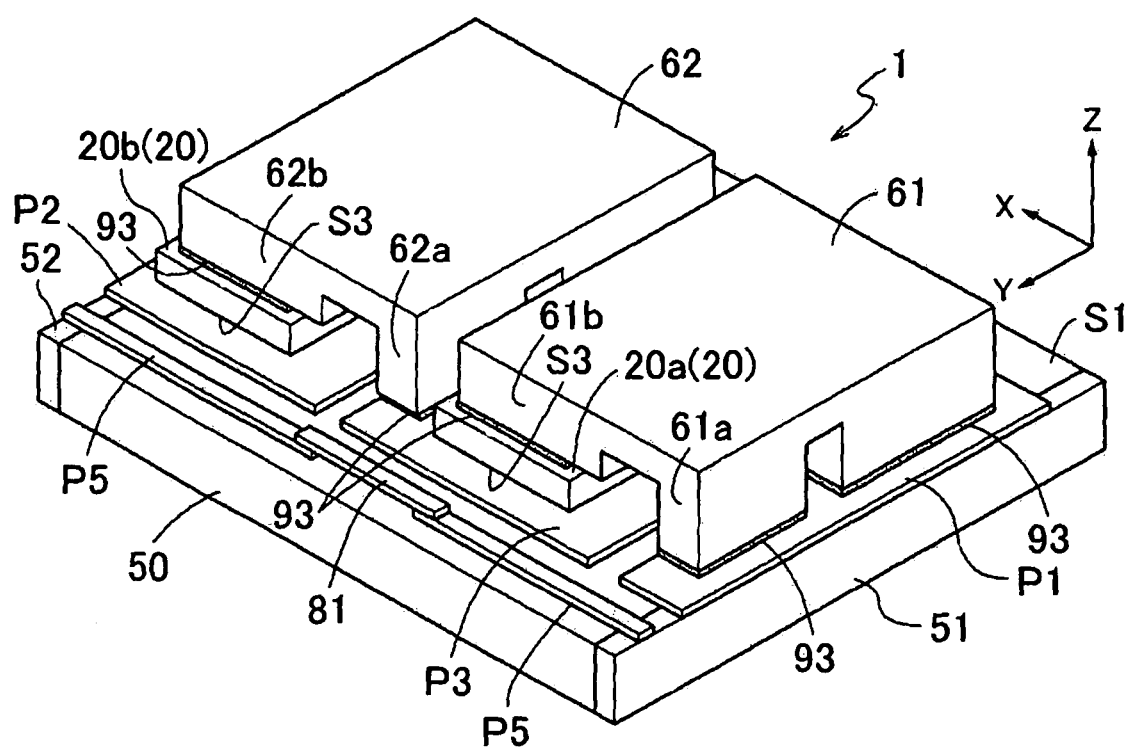
FIG. 1 is a perspective view of a switching element unit according to an embodiment of the present invention.
Figure 2:
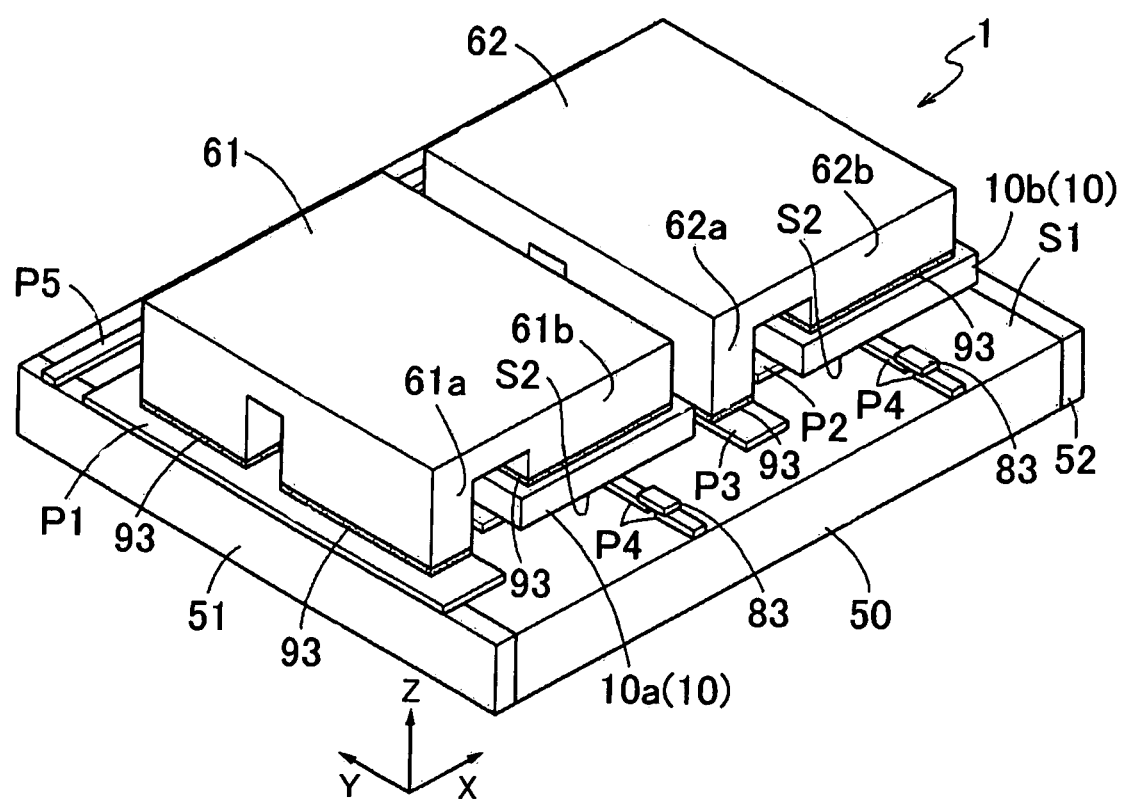
FIG. 2 is a perspective view of the switching element unit according to the embodiment of the present invention as viewed in a direction different from that of FIG. 1.
Figure 3:
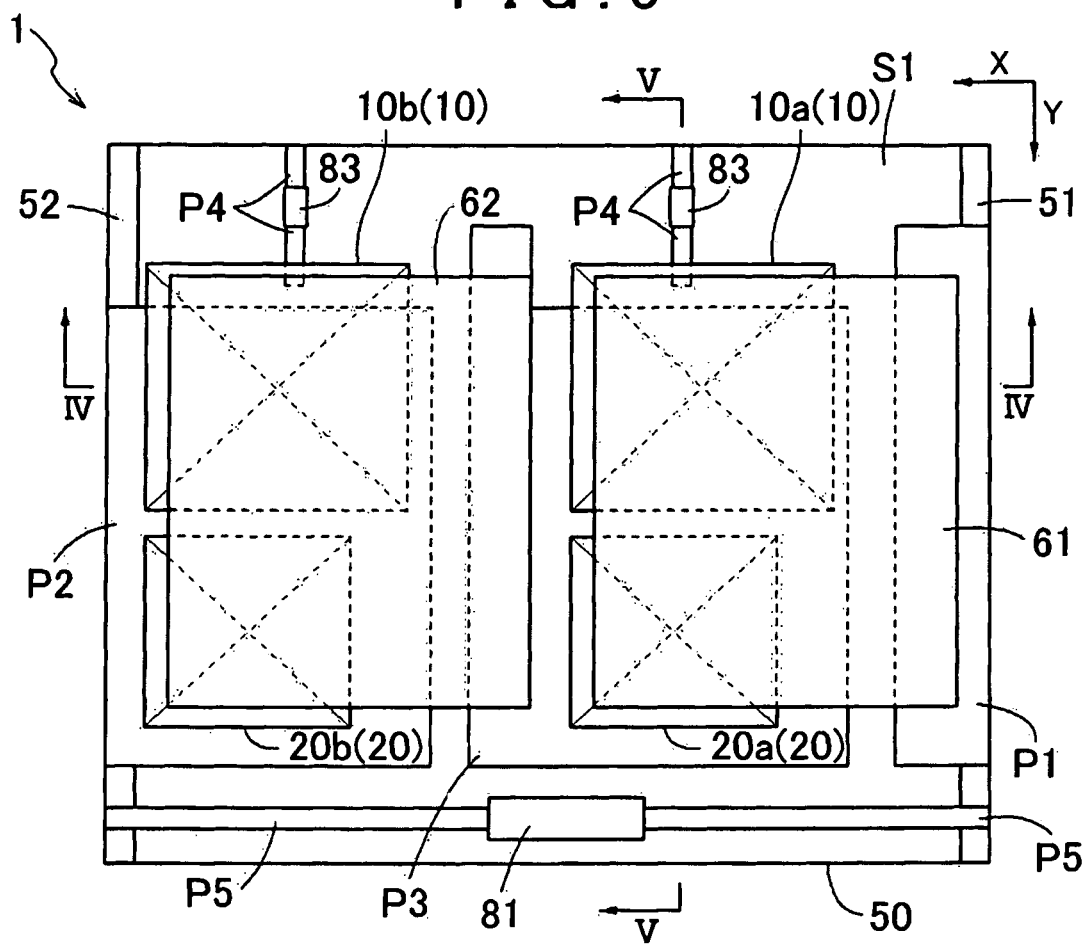
FIG. 3 is a plan view of the switching element unit according to the embodiment of the present invention.
Figure 7:
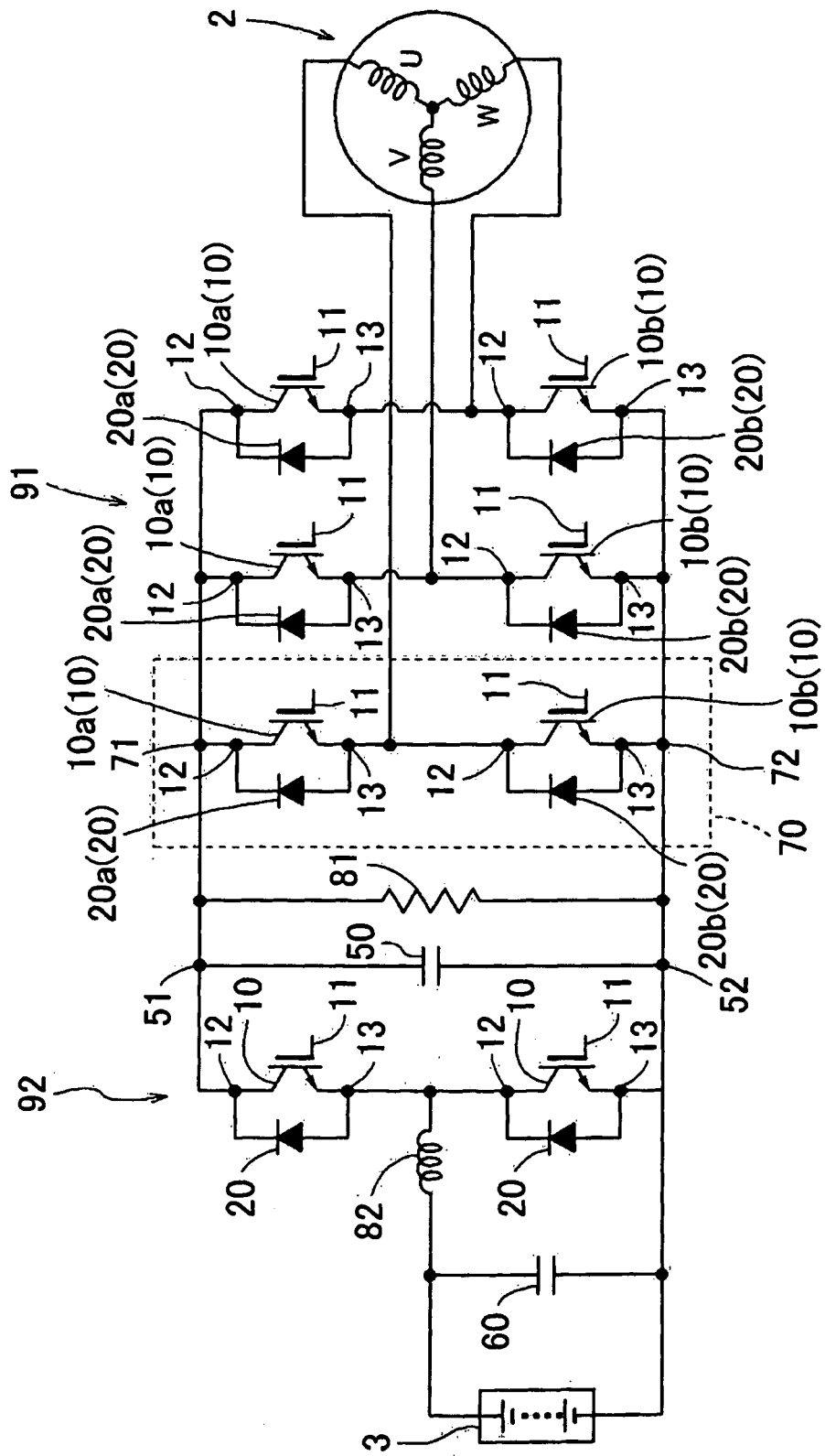
FIG. 7 is a schematic diagram showing the configuration of an inverter circuit according to the embodiment of the present invention.

As shown in FIGS. 1 to 3, the switching element unit 1 includes the switching element 10 and the first smoothing capacitor 50, and in the present embodiment, further includes a diode element 20 electrically connected in parallel to the switching element 10. The first smoothing capacitor 50 is a circuit component that suppresses variation in DC voltage to be supplied to the switching element 10 (i.e., smooths the DC voltage). In the present embodiment, as shown in FIG. 7, a rotating electrical machine drive circuit that drives the rotating electrical machine 2 includes a booster circuit 92 in addition to the inverter circuit 91, and also includes as a smoothing capacitor a second smoothing capacitor 60 in addition to the first smoothing capacitor 50. The booster circuit 92 is a circuit that boosts the DC voltage of a DC power source 3, and includes two switching elements 10, a total of two diode elements 20 electrically connected in parallel to the two switching elements 10, respectively, and a reactor 82. The reactor 82 intermittently stores energy according to switching of the switching elements 10. The DC power source 3 is formed by a battery, a capacitor, etc.

The first smoothing capacitor 50 is electrically connected in parallel to the DC side of the inverter circuit 91, and suppresses variation in DC voltage to be supplied to the switching elements 10 of the inverter circuit 91. A discharge resistor 81 that discharges an electric charge stored in the first smoothing capacitor 50 when the power is off, etc. is electrically connected in parallel to the first smoothing capacitor 50. The second smoothing capacitor 60 is electrically connected in parallel to the DC power source 3, and suppresses variation in DC voltage to be supplied to the switching elements 10 of the booster circuit 92. That is, the first smoothing capacitor 50 is a post-boost smoothing capacitor that smooths the voltage that has been boosted by the booster circuit 92, and the second smoothing capacitor 60 is a pre-boost smoothing capacitor that smooths the voltage that has not been boosted by the booster circuit 92. In the present embodiment, the switching elements 10 of the inverter circuit 91 (an upper stage switching element 10a and a lower stage switching element 10b described below) correspond to the "switching elements" in the present invention, and the first smoothing capacitor 50 corresponds to the "smoothing capacitor" in the present invention.

Figure 6:
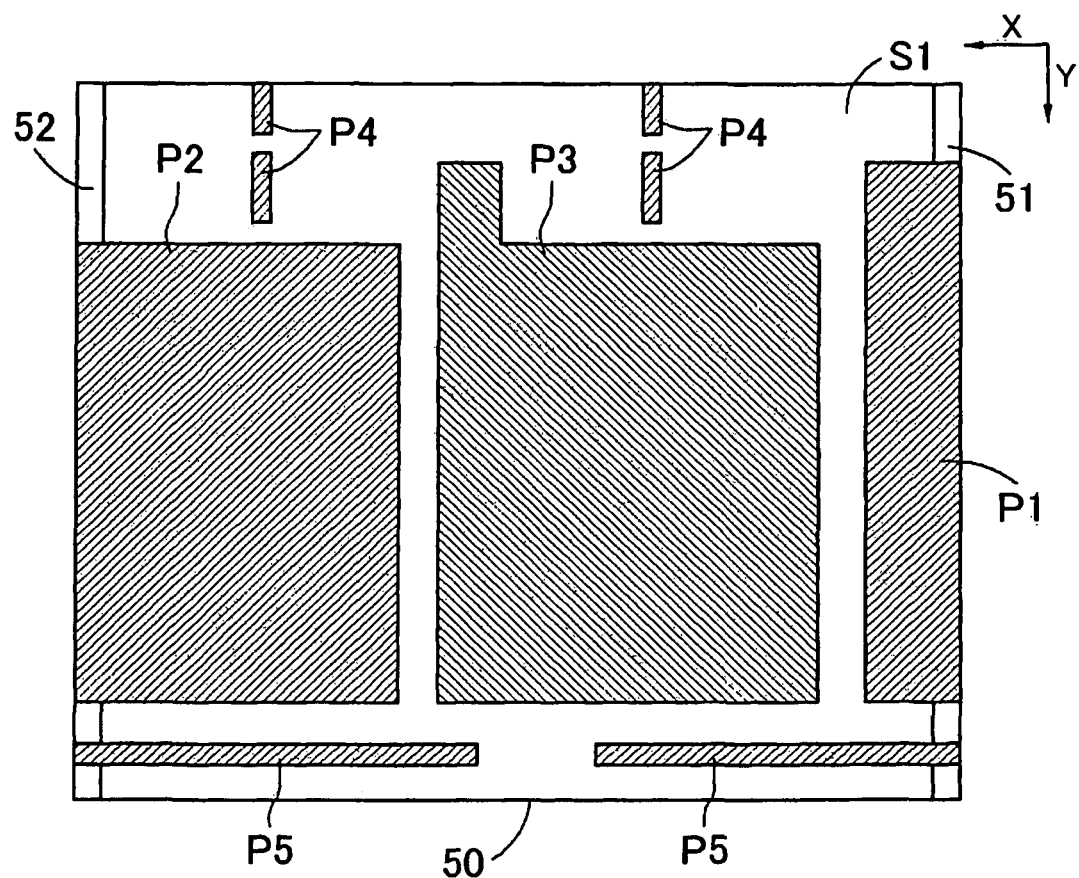
FIG. 6 is a plan view of a first smoothing capacitor according to the embodiment of the present invention.

The element mounting surface S1 is formed in the outer surface of the first smoothing capacitor 50. In the present embodiment, the first smoothing capacitor 50 has an outer shape of a cuboid, and the planar element mounting surface S1 is formed in the upper surface as the upper outer surface of the first smoothing capacitor 50 (the surface facing in the Z direction). As shown in FIG. 6, in the present embodiment, the element mounting surface S1 is formed to have a rectangular shape as viewed in plan.

As described in detail below, capacitor connection electrodes P1, P2 as electrodes that are electrically connected to terminals of the first smoothing capacitor 50 are formed on the element mounting surface S1. The switching elements 10 are arranged (in other words, mounted) on the element mounting surface S1 such that terminals of the switching elements 10 are electrically connected to the capacitor connection electrodes P1, P2. In the present embodiment, the diode elements 20 electrically connected in parallel to the switching elements 10 are also arranged (in other words, mounted) on the element mounting surface S1 such that terminals of the diode elements 20 are electrically connected to the capacitor connection electrodes P1, P2. These switching elements 10 and diode elements 20 are arranged (i.e., placed) on the element mounting surface S1 or the electrodes formed on the element mounting surface S1 from above. The capacitor connection electrodes P1, P2 that are formed on the element mounting surface S1, and an inter-element connection electrode P3, a control electrode P4, and a discharge resistor electrode P5 which will be described below may be, e.g., electrodes made of conductive foil (copper foil etc.). Such electrodes can be formed on the element mounting surface S1 by using, e.g., a printing technique.

The first smoothing capacitor 50 includes the first terminal 51 as a positive electrode-side terminal, and the second terminal 52 as a negative electrode-side terminal. These terminals 51, 52 function as input/output terminals of DC power between the DC power source 3 and the booster circuit 92, and also function as input/output terminals of DC power between the DC power source 3 and the inverter circuit 91. In the present embodiment, as shown in FIG. 4, the first terminal 51 is placed at the end on the −X direction side of the first smoothing capacitor 50, and the second terminal 52 is placed at the end on the X direction side of the first smoothing capacitor 50. Both the first terminal 51 and the second terminal 52 are formed to be exposed on the upper surface of the first smoothing capacitor 50. That is, in the present embodiment, the upper surface of the first smoothing capacitor 50 includes a portion that is formed by the upper end of the first terminal 51 and a portion that is formed by the upper end of the second terminal 52. Moreover, in the present embodiment, as shown in FIGS. 1, 2, and 4, the first terminal 51 is formed so as to be exposed on the side surface on the −X direction side of the first smoothing capacitor 50 (the outer surface on the lateral side; the same applies to the following description) and to be exposed on the side surfaces on both Y and −Y direction sides of the first smoothing capacitor 50. In the present embodiment, as shown in FIGS. 1, 2, and 4, the second terminal 52 is formed to be exposed on the side surface on the X direction side of the first smoothing capacitor 50 and to be exposed on the side surfaces on both Y and −Y direction sides of the first smoothing capacitor 50.

Figure 5:
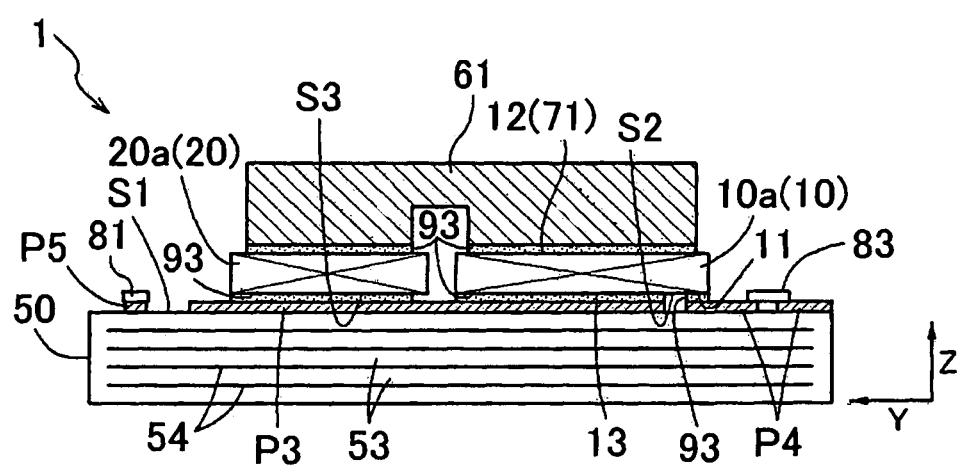
FIG. 5 is a sectional view taken along line V-V in FIG. 3.

In the present embodiment, each dielectric portion 53 interposed between electrodes of the first smoothing capacitor 50 serves as a ceramic capacitor made of a ceramic material. This ceramic material is, e.g., barium titanate, strontium titanate, alumina. Specifically, as schematically shown in FIGS. 4 and 5, the first smoothing capacitor 50 is a stacked ceramic capacitor, and has a structure in which the dielectric portions 53 are stacked in the stacking direction (in this example, the vertical direction) with an internal electrode 54 interposed therebetween. As the internal electrode 54, positive electrode-side internal electrodes 54 electrically connected to the first terminal 51 and negative electrode-side internal electrodes 54 electrically connected to the second terminal 52 are alternately arranged in the stacking direction. The positive electrode-side internal electrodes 54 are formed to extend in the first smoothing capacitor 50 from the first terminal 51 in the X direction. The negative electrode-side internal electrodes 54 are formed to extend in the first smoothing capacitor 50 from the second terminal 52 toward in −X direction. In the present embodiment, the internal electrodes 54 are formed to extend parallel to the element mounting surface S1. Both the first terminal 51 and the second terminal 52 function as external electrodes, and are formed to extend along the entire length in the stacking direction of the first smoothing capacitor 50. Although the number of stacks of the dielectric portions 53 is "5" in FIGS. 4 and 5, an actual number of stacks of the dielectric portions 53 may be any value. For example, a capacitor in which the number of stacks of the dielectric portions 53 is 100 or more may be used as the first smoothing capacitor 50.

The element mounting surface S1 formed in the outer surface of the first smoothing capacitor 50 is formed integrally with the dielectric portion 53. Specifically, in the present embodiment, the upper surface of the first smoothing capacitor 50 (specifically, the portion excluding the terminals 51, 52) is formed by the dielectric portion 53 located at the upper end, and the lower surface as the lower outer surface of the first smoothing capacitor 50 (specifically, the portion excluding the terminals 51, 52) is formed by the dielectric portion 53 located at the lower end. That is, in the present embodiment, the upper surface of the first smoothing capacitor 50 in which the element mounting surface S1 is formed (specifically, the upper surface excluding the terminals 51, 52) and the lower surface of the first smoothing capacitor 50 (specifically, the lower surface excluding the terminals 51, 52) are integrally formed by using the same material as the dielectric portions 53. Capacitors manufactured by using various known techniques can be used as such a first smoothing capacitor 50. For example, a capacitor manufactured by low temperature co-firing by using a low temperature co-fired ceramics (LTCC) technique can be used as the first smoothing capacitor 50. In this case, it is preferable that the material of the electrodes that are formed on the element mounting surface S1 (e.g., the capacitor connection electrodes P1, P2) be a material having such a melting point that allows these electrodes to be formed simultaneously with formation of the dielectric portions 53 by firing (e.g., the same material as the internal electrodes 54).

A capacitor manufactured by using a technique of forming a film by injecting an aerosol of fine particles (aerosol deposition technique) may be used as the first smoothing capacitor 50. Specifically, a capacitor manufactured by alternately forming the dielectric portions 53 and the inner electrodes 54 in the stacking direction by using the aerosol deposition technique can be used as the first smoothing capacitor 50. In this case, the electrodes that are formed on the element mounting surface S1 (e.g., the capacitor connection electrodes P1, P2) can also be formed by using the aerosol deposition technique. For example, fine particles of one or more of $Al_2O_3$, AlN, $Si_3N_4$, BN, MgO, and $BaTiO_3$ may be used as the fine particles forming the dielectric portions 53. For example, the dielectric portions 53 may be formed by using alumina fine particles (an example of ceramic fine particles). For example, fine particles of a material such as Cu or Ag may be used as the fine particles forming the internal electrodes 54.

2. Configuration of Switching Element Series Circuit

A switching element series circuit 70 that is formed by the switching elements 10 included in the switching element unit 1 will be described. As shown in FIGS. 2 and 3, in the present embodiment, two switching elements 10 are placed on the element mounting surface S1. As described below, the switching element series circuit 70 shown in FIG. 7 is formed by electrically connecting these two switching elements 10 in series with each other. In other words, the two switching elements 10 forming the switching element series circuit 70 are placed on the same element mounting surface S1.

As shown in FIG. 7, the switching element series circuit 70 includes a first end 71 that is connected to the positive electrode side of the DC power source 3, and a second end 72 that is connected to the negative electrode side of the DC power source 3 (e.g., the ground side). In the present embodiment, the first end 71 of the switching element series circuit 70 is electrically connected to the positive electrode of the DC power source 3 via the switching elements 10 and the reactor 82 of the booster circuit 92, so that the DC voltage boosted by the booster circuit 92 is supplied to the first end 71 of the switching element series circuit 70.

The switching element series circuit 70 forms one leg (a set of upper and lower arms) of the inverter circuit 91 that converts a DC voltage to an AC voltage. In the present embodiment, as shown in FIG. 7, the rotating electrical machine 2 to which the AC voltage is to be supplied is an AC electric motor that is driven by a three-phase alternating current, and the inverter circuit 91 is formed by electrically connecting in parallel a total of three legs (arm sets) respectively corresponding to the three phases (U phase, V phase, and W phase). In FIG. 7, in order to avoid complexity, only the leg corresponding to U phase is shown with "70" representing the switching element series circuit, "71" representing the first end, and "72" representing the second end. In the present embodiment, one first smoothing capacitor 50 is electrically connected in parallel to each leg (each switching element series circuit 70). However, in order to avoid complexity, FIG. 7 shows an example in which one first smoothing capacitor 50 is connected to the three legs. The rotating electrical machine 2 to be controlled by the inverter circuit 91 may be, e.g., a rotating electrical machine that is provided as a driving force source of wheels in electric vehicles, hybrid vehicles. In this specification, the term "rotating electrical machine" is used as a concept including a motor (electric motor), a generator (electric generator), and a motor generator that functions both as a motor and a generator as necessary.

As shown in FIG. 7, the first end 71 of the switching element series circuit 70 is electrically connected to the first terminal 51 as a positive electrode-side terminal of the first smoothing capacitor 50, and the second end 72 of the switching element series circuit 70 is electrically connected to the second terminal 52 as a negative electrode-side terminal of the first smoothing capacitor 50. The diode elements 20 are electrically connected in parallel to the two switching elements 10 of the switching element series circuit 70, respectively. The configuration of the switching element unit 1, which implements such an electric connection configuration, will be described below.

As described above, the capacitor connection electrodes P1, P2 electrically connected to the terminals 51, 52 of the first smoothing capacitor 50 are formed on the element mounting surface S1. Specifically, as shown in FIG. 6, the first capacitor connection electrode P1 electrically connected to the first terminal 51 and the second capacitor connection electrode P2 electrically connected to the second terminal 52 are formed on the element mounting surface S1. In the present embodiment, the discharge resistor electrode P5 having both a portion electrically connected to the first terminal 51 and a portion electrically connected to the second terminal 52 is also formed on the element mounting surface S1. Each of the first capacitor connection electrode P1 and the portion of the discharge resistor electrode P5 which is electrically connected to the first terminal 51 is formed so as to cover a part of the upper surface of the first terminal 51, and thus is electrically connected to the first terminal 51. Each of the second capacitor connection electrode P2 and the portion of the discharge resistor electrode P5 which is electrically connected to the second terminal 52 is formed so as to cover a part of the upper surface of the second terminal 52, and thus is electrically connected to the second terminal 52.

As described below, the first capacitor connection electrode P1 and the second capacitor connection electrode P2 are electrodes that electrically connect the switching element 10 and the first smoothing capacitor 50. Thus, in the present embodiment, the connection portions to an inverter circuit 91 side in the external electrodes of the first smoothing capacitor 50 are formed by the upper surfaces of the first terminal 51 and the second terminal 52. Although detailed description will be omitted, the connection portions to a DC power source 3 side in the external electrodes of the first smoothing capacitor 50 can also be formed by the upper surfaces of the first terminal 51 and the second terminal 52. The connection portions to the DC power source 3 side in the external electrodes of the first smoothing capacitor 50 may be formed by the side surfaces or the lower surfaces of the first terminal 51 and the second terminal 52.

As shown in FIG. 6, the inter-element connection electrode P3 and the control electrode P4 in addition to the three electrodes P1, P2, P5 are formed on the element mounting surface S1. These electrodes P3, P4 are electrodes that are electrically isolated from the terminals 51, 52 of the first smoothing capacitor 50. As used herein, the expression "electrically isolated" means that the electrodes are electrically isolated on the element mounting surface S1, and is used as a conception including the case where the electrodes are electrically connected to the terminals of the first smoothing capacitor 50 via a circuit element, an interconnect member, etc. that is placed on the element mounting surface S1.

As shown in FIG. 6, the inter-element connection electrode P3 is placed between the first capacitor connection electrode P1 and the second capacitor connection electrode P2 in the extending direction of the element mounting surface S1 (in this example, the X direction). In the present embodiment, the first capacitor connection electrode P1, the second capacitor connection electrode P2, and the inter-element connection electrode P3 are formed to have an overlapping portion as viewed in the X direction. That is, there is a region in the Y direction, which is included in all of the following three regions. A region in the Y direction where the first capacitor connection electrode P1 is formed, a region in the Y direction where the second capacitor connection electrode P2 is formed, and a region in the Y direction where the inter-element connection electrode P3 is formed. The inter-element connection electrode P3 is formed to be interposed between the first capacitor connection electrode P1 and the second capacitor connection electrode P2 from both sides in the X direction. Each of these three electrodes P1 to P3 is formed in a rectangular shape. In this example, as shown in FIG. 3, in a part on the X-direction side of the inter-element connection electrode P3 where a second connection member 62 (described below) is placed, the inter-element connection electrode P3 has a portion that protrudes in the −Y direction from the rectangular portion. In the present embodiment, a connection member (not shown) connected to a coil of the rotating electrical machine 2 is connected to this protruding portion.

As shown in FIG. 3, the two switching elements 10 forming the switching element series circuit 70 are arranged next to each other in the X direction on the element mounting surface S1. In the present embodiment, as shown in FIG. 6, the element mounting surface S1 is formed in a rectangular shape having longer and shorter sides such that the X direction is parallel to the extending direction of the longer sides and the Y direction is parallel to the extending direction of the shorter sides. The diode element 20 electrically connected in parallel to the switching element 10 is placed next to this switching element 10 in the Y direction on the element mounting surface S1. Specifically, the diode element 20 is placed on the Y direction side of the switching element 10 to be connected to this diode element 20, so as to adjoin this switching element 10. As used herein, the expression "placed so as to adjoin" means that no other circuit element is located between the switching element 10 and the diode element 20 in the extending direction of the element mounting surface S1 (in this example, the Y direction), and is used as a concept including both the state where the separation distance between the switching element 10 and the diode element 20 is zero (that is, the state where the respective outer surfaces are in contact with each other) and the state where the separation distance is larger than zero.

As shown in FIGS. 5 and 7, the switching element 10 includes a pair of main terminals 12, 13 and a control terminal 11. The main terminals 12, 13 are terminals that are electrically connected to a DC voltage supply source (in this example, the DC power source 3). Of the pair of main terminals 12, 13, the positive electrode-side main terminal 12 is the terminal on the high potential side, and the negative electrode-side main terminal 13 is the terminal on the low potential side. The diode element 20 is electrically connected to the switching element 10 in an antiparallel relation so that a cathode terminal is electrically connected to the positive electrode-side main terminal 12 and an anode terminal is electrically connected to the negative electrode-side main terminal 13. That is, the diode element 20 functions as a free wheel diode (FWD). The control terminal 11 is a control terminal that controls switching of the switching element 10. When the switching element 10 is on, electric connection is obtained between the positive electrode-side main terminal 12 and the negative electrode-side main terminal 13. When the switching element 10 is off, the electric connection between the positive electrode-side main terminal 12 and the negative electrode-side main terminal 13 is cut off.

As shown in FIG. 7, the positive electrode-side main terminal 12 of the upper stage switching element 10a that is located on the high potential side in the two switching elements 10 is electrically connected to the first end 71 of the switching element series circuit 70. That is, the upper stage switching element 10a is one of the two switching elements 10 of the switching element series circuit 70, which is located on a first end 71 side. The negative electrode-side main terminal 13 of the lower stage switching element 10b that is located on the low potential side in the two switching elements 10 is electrically connected to the second end 72 of the switching element series circuit 70. That is, the lower stage switching element 10b is one of the two switching elements 10 of the switching element series circuit 70, which is located on a second end 72 side. The connection point between the negative electrode-side main terminal 13 of the upper stage switching element 10a and the positive electrode-side main terminal 12 of the lower stage switching element 10b (the series connection point of the switching element series circuit 70) is electrically connected to the coil of the rotating electrical machine 2. In the present embodiment, the upper stage switching element 10a corresponds to the "first switching element" in the present invention, and the lower stage switching element 10b corresponds to the "second switching element" in the present invention.

In the present embodiment, as shown in FIG. 7, the switching element 10 is an insulated gate bipolar transistor (IGBT), in which the positive electrode-side main terminal 12 is formed by a collector terminal, the negative electrode-side main terminal 13 is formed by an emitter terminal, and the control terminal 11 is formed by a gate terminal. The control terminal 11 is electrically connected to a control unit, not shown, via a gate resistor 83 (see FIGS. 3 and 5), and switching of each switching element 10 is individually controlled according to the gate voltage that is applied to the control terminal 11. Metal oxide semiconductor field effect transistors (MOSFETs) etc. may be used as the switching elements 10.

As shown in FIG. 5, in the switching element 10 having an outer shape of a cuboid, the positive electrode-side main terminal 12 and the negative electrode-side main terminal 13 are separately formed on the outer surfaces of the switching element 10 which face opposite sides to each other. Specifically, the switching element 10 has an outer surface having the positive electrode-side main terminal 12 formed thereon, and an outer surface having the negative electrode-side main terminal 13 formed thereon, and these two outer surfaces face in the opposite directions to each other and are parallel to each other. The switching element 10 is placed on the element mounting surface S1 so that the outer surface having the negative electrode-side main terminal 13 formed thereon serves as a first opposing mounting surface S2 facing the element mounting surface S1. That is, with the switching element 10 being placed on the element mounting surface S1, the positive electrode-side main terminal 12 is located on the upper surface of the switching element 10, and the negative electrode-side main terminal 13 is located on the lower surface of the switching element 10. In the present embodiment, the control terminal 11 is located at an insulation distance from the negative electrode-side main terminal 13 on the outer surface of the switching element 10 having the negative electrode-side main terminal 13 formed thereon. That is, in the present embodiment, the main terminal 12, 13 (specifically, the negative electrode-side main terminal 13) is formed on the first opposing mounting surface S2 of the switching element 10. In the present embodiment, the control terminal 11 is also formed on the first opposing mounting surface S2.

The switching element 10 is placed on the element mounting surface S1 so that the first opposing mounting surface S2 contacts the element mounting surface S1 directly or via a bonding member. The element mounting surface S1 in the expression "contacts the element mounting surface S1 directly or via a bonding member" includes the electrodes formed on the element mounting surface S1. Specifically, as shown in FIGS. 3 to 5, the upper stage switching element 10a is placed from above on the inter-element connection electrode P3 via a bonding material 93, and an upper stage diode element 20a as the diode element 20 electrically connected in parallel to the upper stage switching element 10a is also placed from above on the inter-element connection electrode P3 via the bonding material 93. In this example, the anode terminal is formed on the lower surface of the diode element 20, and the cathode terminal is formed on the upper surface of the diode element 20. That is, the lower surface of the diode element 20 serves as a second opposing mounting surface S3 facing the element mounting surface S1, and the diode element 20 is placed over the element mounting surface S1 so that the second opposing mounting surface S3 contacts the element mounting surface S1 directly or via the bonding member. In the present embodiment, the anode terminal is formed on the second opposing mounting surface S3. The bonding material 93 is comprised of a conductive material such as, e.g., solder or conductive paste. Thus, the negative electrode-side main terminal 13 formed on the lower surface of the upper stage switching element 10a and the anode terminal formed on the lower surface of the upper stage diode element 20a are electrically connected to the inter-element connection electrode P3. The bonding material 93 corresponds to the "bonding member" in the present invention.

The lower stage switching element 10b is placed from above on the second capacitor connection electrode P2 via the bonding material 93. A lower stage diode element 20b as the diode element 20 electrically connected in parallel to the lower stage switching element 10b is also placed from above on the second capacitor connection electrode P2 via the bonding material 93. Thus, the negative electrode-side main terminal 13 formed on the lower surface of the lower stage switching element 10b and the anode terminal formed on the lower surface of the lower stage diode element 20b are electrically connected to the second capacitor connection electrode P2. The second capacitor connection electrode P2 is electrically connected to the second terminal 52, and the negative electrode-side main terminal 13 of the lower stage switching element 10b and the anode terminal of the lower stage diode element 20b are electrically connected to the second terminal 52 via the second capacitor connection electrode P2. Thus, the second capacitor connection electrode P2 is an electrode that electrically connects the second end 72 of the switching element series circuit 70 formed by the negative electrode-side main terminal 13 of the lower stage switching element 10b to the second terminal 52 of the first smoothing capacitor 50.

As shown in FIGS. 1 and 2, a conductive first connection member 61 is placed so as to electrically connect the positive electrode-side main terminal 12 (see FIGS. 4 and 5) formed on the upper surface of the upper stage switching element 10a and the cathode terminal formed on the upper surface of the upper stage diode element 20a to the first capacitor connection electrode P1. That is, the first connection member 61 electrically connects the first capacitor connection electrode P1 and the upper stage switching element 10a. Specifically, as shown in FIG. 4, the first connection member 61 has a first portion 61a placed from above on the first capacitor connection electrode P1 via the bonding material 93, and a second portion 61b placed from above on the upper stage switching element 10a and the upper stage diode element 20a via the bonding material 93. That is, the first portion 61a is a portion of the first connection member 61 which contacts the first capacitor connection electrode P1 directly or via the bonding member. The second portion 61b is a portion of the first connection member 61 which contacts the upper stage switching element 10a directly or via the bonding member. In the present embodiment, the second portion 61b is also a portion that contacts the upper stage diode element 20a directly or via the bonding member. Thus, the positive electrode-side main terminal 12 of the upper stage switching element 10a and the cathode terminal of the upper stage diode element 20a are electrically connected to the first capacitor connection electrode P1. The first capacitor connection electrode P1 is electrically connected to the first terminal 51, and the positive electrode-side main terminal 12 of the upper stage switching element 10a and the cathode terminal of the upper stage diode element 20a are electrically connected to the first terminal 51 via the first capacitor connection electrode P1. Thus, the first capacitor connection electrode P1 is an electrode that electrically connects the first end 71 of the switching element series circuit 70, which is formed by the positive electrode-side main terminal 12 of the upper stage switching element 10a, to the first terminal 51 of the first smoothing capacitor 50.

As shown in FIGS. 1 and 2, the conductive second connection member 62 is placed so as to electrically connect the positive electrode-side main terminal 12 (see FIG. 4) formed on the upper surface of the lower stage switching element 10b and the cathode terminal formed on the upper surface of the lower stage diode element 20b to the inter-element connection electrode P3. That is, the second connection member 62 electrically connects the inter-element connection electrode P3 and the lower stage switching element 10b. Specifically, as shown in FIG. 4, the second connection member 62 has a first portion 62a placed from above on the inter-element connection electrode P3 via the bonding material 93, and a second portion 62b placed from above on the lower stage switching element 10b and the lower stage diode element 20b via the bonding material 93. That is, the first portion 62a is a portion of the second connection member 62 which contacts the inter-element connection electrode P3 directly or via the bonding member. The second portion 62b is a portion of the second connection member 62 which contacts the lower stage switching element 10b directly or via the bonding member. In the present embodiment, the second portion 62b is also a portion that contacts the lower stage diode element 20b directly or via the bonding member. Thus, the positive electrode-side main terminal 12 of the lower stage switching element 10b and the cathode terminal of the lower stage diode element 20b are electrically connected to the inter-element connection electrode P3. As a result, the negative electrode-side main terminal 13 of the upper stage switching element 10a and the anode terminal of the upper stage diode element 20a are electrically connected to the positive electrode-side main terminal 12 of the lower stage switching element 10b and the cathode terminal of the lower stage diode element 20b via the inter-element connection electrode P3. Thus, the inter-element connection electrode P3 is an electrode that electrically connects the two switching terminals 10 (specifically, the upper stage switching element 10a and the lower stage switching element 10b).

In the present embodiment, as shown in FIGS. 1, 4, etc., each of the first connection member 61 and the second connection member 62 has a flat portion in its upper surface. Although not shown in the figures, a heat sink is placed on the upper side of the flat portion with an insulating member interposed therebetween. This insulating member has both an electrical insulation property and a heat conductive property. This allows the heat of the switching element 10 to be efficiently transmitted to the heat sink via the connection members 61, 62 while ensuring electrical insulation between the switching element 10 and the heat sink. Thus, the connection members 61, 62 have a function as a heat spreader in addition to the function as a connection member (bus bar).

The control electrode P4 is a control electrode that is electrically connected to the control terminal 11. As shown in FIG. 5, the control electrode P4 has a portion that is located below the control terminal 11 and electrically connected to the control terminal 11, and a portion separated from this portion in the −Y direction (a separated portion). The gate resistor 83 is placed from above on the control electrode P4 so as to electrically connect these two portions. Although not shown in the figures, a connection terminal of a flexible printed board is formed in the separated portion, and the control terminal 11 is electrically connected to a control unit (not shown) that generates a switching control signal (in this example, a gate drive signal) via the flexible printed board. The flexible printed board is a printed board that is flexible and is deformable to a large extent.

The discharge resistor electrode P5 is an electrode on which the discharge resistor 81 (see FIG. 7) electrically connected in parallel to the first smoothing capacitor 50 is placed. Specifically, as shown in FIG. 6, the discharge resistor electrode 25 has two portions that are separated from each other in the X direction, namely, a portion electrically connected to the first terminal 51 and a portion electrically connected to the second terminal 52. As shown in FIG. 1, the discharge resistor 81 is placed from above on the discharge resistor electrode P5 so as to electrically connect these two portions.

3. Other Embodiments

Lastly, other embodiments of the switching element unit according to the present invention will be described below. The configuration disclosed in each of the following embodiments may be combined with any of the configurations disclosed in the other embodiments as long as no consistency arises.

(1) The above embodiment is described with respect to an example in which the element mounting surface S1 is made of the same material as that of the dielectric portions 53. However, embodiments of the present invention are not limited to this, and the element mounting surface S1 may be made of a material different from that of the dielectric portions 53. The above embodiment is described with respect to an example in which two switching elements 10 are placed on the element mounting surface S1. However, the number of switching elements 10 that are placed on the element mounting surface S1 can be changed as appropriate, and an odd number (e.g., one) of switching elements 10 may be placed on the element mounting surface S1.

(2) The above embodiment is described with respect to an example in which the control terminal 11 is formed on the first opposing mounting surface S2 of the switching element 10. However, embodiments of the present invention are not limited to this, and the control terminal 11 may be formed on the outer surface of the switching element 10 other than the first opposing mounting surface S2 (e.g., the upper surface as the upper outer surface). In this case, for example, the control terminal 11 may be electrically connected to the control electrode P4 via a wire member. In this case, the control electrode P4 may not be formed on the element mounting surface S1, and the control terminal 11 may be electrically connected to a control unit (not shown) that generates a switching control signal (in this example, a gate drive signal), not via the element mounting surface S1.

(3) The above embodiment is described with respect to an example in which the diode element 20 electrically connected in parallel to the switching element 10 is placed on the element mounting surface S1 so as to adjoin the switching element 10. However, embodiments of the present invention are not limited to this, and another circuit element may be placed between the diode element 20 and the switching element 10 in the extending direction of the element mounting surface S1. Alternatively, the diode element 20 may be placed on the outer surface other than the element mounting surface S1 (e.g., the lower surface as the outer surface on the −Z direction side of the first smoothing capacitor 50), or may be placed on a member different from the first capacitor 50. The diode element 20 that is electrically connected in parallel to the switching element 10 may not be provided.

(4) The above embodiment is described with respect to an example in which two switching elements 10 forming the switching element series circuit 70 are placed on the element mounting surface S1. However, embodiments of the present invention are not limited to this. For example, four or six switching elements 10 forming the inverter circuit 91 may be placed on the element mounting surface S1. For example, an arrangement configuration in which three units each forming a single switching element series circuit 70 (the portion shown in FIG. 3 in the above embodiment) are arranged along the Y direction as shown in FIG. 8 may be used as a configuration in which six switching elements 10 are placed on the element mounting surface S1. In order to avoid complexity, portions relating to the discharge resistor 81 and the gate resistor 83 are not shown in FIG. 8. In such a configuration, the total of three first smoothing capacitors 50 each provided for a corresponding leg (a corresponding switching element series circuit 70) in the above embodiment may be unified and formed as a single first smoothing capacitor 50 (the capacitance is three times).

(5) The above embodiment is described with respect to an example in which the first capacitor connection electrode P1, the second capacitor connection electrode P2, and the inter-element connection electrode P3 are formed so as to have an overlapping portion as viewed in the X direction. However, embodiments of the present invention are not limited to this, and the first capacitor connection electrode P1, the second capacitor connection electrode P2, and the inter-element connection electrode P3 may be placed in two or three regions that do not overlap each other as viewed in the X direction (regions separated from each other in the Y direction). The above embodiment is described with respect to an example in which the inter-element connection electrode P3 is placed between the first capacitor connection electrode P1 and the second capacitor connection electrode P2 in the extending direction of the element mounting surface S1. However, the inter-element connection electrode P3 may be placed on the Y direction side or the −Y direction side of the first capacitor connection electrode P1 or the second capacitor connection electrode P2 so as to have an overlapping portion as viewed in the Y direction.

(6) The above embodiment is described with respect to an example in which the inverter circuit 91 is a DC-AC conversion circuit that coverts a DC voltage to a three-phase AC voltage, and the inverter circuit 91 includes six switching elements 10. However, embodiments of the present invention are not limited to this, and the inverter circuit 91 may be a DC-AC conversion circuit that coverts a DC voltage to a single-phase AC voltage, and the inverter circuit 91 may include four switching elements 10. In this case, as in the above embodiment, two switching elements 10 may be placed on the element mounting surface S1, or unlike the above embodiment, four switching elements 10 may be placed on the element mounting surface S1.

(7) The above embodiment is described with respect to an example in which the switching element unit according to the present invention is applied to the inverter circuit 91 (see FIG. 7) that controls the rotating electrical machine 2. However, embodiments of the present invention are not limited to this, and the switching element unit according to the present invention is also applicable to other circuits such as the booster circuit 92. For example, in the case where the switching element unit according to the present invention is applied to the booster circuit 92, an element mounting surface may be formed in the outer surface of the second smoothing capacitor 60, and the switching elements 10 forming the booster circuit 92 may be placed on the element mounting surface. Although detailed description is omitted, in such a configuration, the present invention can be configured similarly to the above embodiment except that the element mounting surface S1 in the above embodiment is replaced with the element mounting surface of the second smoothing capacitor 60.

(8) The above embodiment is described with respect to an example in which the rotating electrical machine drive circuit that drives the rotating electrical machine 2 includes the booster circuit 92 in addition to the inverter circuit 91. However, embodiments of the present invention are not limited to this, and the rotating electrical machine drive circuit that drives the rotating electrical machine 2 may not include the booster circuit 92.

(9) The above embodiment is described with respect to an example in which the first smoothing capacitor 50 is a ceramic capacitor in which the dielectric portions 53 interposed between the electrodes are made of a ceramic material. However, embodiments of the present invention are not limited to this. That is, the dielectric portions 53 of the first smoothing capacitor 50 may be made of a material other than the ceramic material (e.g., a synthetic resin).

(10) Regarding other configurations as well, the embodiments disclosed in the specification are by way of example in all respects, and embodiments of the present invention are not limited to them. That is, the configurations that are not described in the claims can be modified as appropriate without departing from the object of the present invention.

The present invention can be preferably used in switching element units having switching elements.

The invention claimed is:

1. A switching element unit comprising:
a switching element; and
a smoothing capacitor that suppresses variation in DC voltage to be supplied to the switching element, wherein
the smoothing capacitor includes positive electrode-side internal electrodes and negative electrode-side internal electrodes alternatively arranged in a stacking direction,
dielectric portions are stacked in the stacking direction with the positive electrode-side internal electrodes and the negative electrode-side internal electrodes interposed therebetween,
an element mounting surface formed in an outer surface of the smoothing capacitor is formed integrally with the dielectric portions,
a capacitor connection electrode as an electrode that is electrically connected to a terminal of the smoothing capacitor is formed on the element mounting surface,
the switching element is placed on the element mounting surface such that a main terminal of the switching element is electrically connected to the capacitor connection electrode, and
the switching element has an opposing mounting surface facing the element mounting surface,
the switching element is placed on the element mounting surface so that the opposing mounting surface contacts the element mounting surface directly or via a bonding member, and
the switching element includes on the opposing mounting surface the main terminal that is electrically connected to a supply source of the DC voltage.

2. The switching element unit according to claim 1, wherein
a control terminal that controls the switching element is formed on the opposing mounting surface, and
a control electrode that is electrically connected to the control terminal is formed on the element mounting surface.

3. The switching element unit according to claim 2, further comprising:
a diode element that is electrically connected in parallel to the switching element, wherein
the diode element is placed on the element mounting surface.

4. The switching element unit according to claim 3, wherein
the opposing mounting surface facing the element mounting surface of the switching element is a first opposing mounting surface,
the diode element includes on a second opposing mounting surface facing the element mounting surface a terminal that is electrically connected to the capacitor connection electrode, and
the diode element is placed on the element mounting surface so that the second opposing mounting surface contacts the element mounting surface directly or via a bonding member.

5. The switching element unit according to claim 4, wherein
two of the switching elements that are electrically connected in series to each other to form a switching element series circuit are placed on the element mounting surface, and
a first capacitor connection electrode that electrically connects a first end of the switching element series circuit and a first terminal of the smoothing capacitor, a second capacitor connection electrode that electrically connects a second end of the switching element series circuit and a second terminal of the smoothing capacitor, and an inter-element connection electrode that electrically connects the two switching elements are formed on the element mounting surface.

6. The switching element unit according to claim 5, wherein
the inter-element connection electrode is placed between the first capacitor connection electrode and the second capacitor connection electrode in an extending direction of the element mounting surface.

7. The switching element unit according to claim 5, wherein
of the two switching elements forming the switching element series circuit, the switching element that is placed on a first end side is a first switching element, and the switching element that is placed on a second end side is a second switching element,
the switching element unit further comprises:
a first connection member that electrically connects the first capacitor connection electrode and the first switching element: and a second connection member that electrically connects the inter-element connection electrode and the second switching element,
the first connection member has a first portion that contacts the first capacitor connection electrode directly or via a bonding member, and a second portion that contacts the first switching element directly or via a bonding member, and
the second connection member has a first portion that contacts the inter-element connection electrode directly or via a bonding member, and a second portion that contacts the second switching element directly or via a bonding member.

8. The switching element unit according to claim 7, wherein
six of the switching elements forming a DC-AC conversion circuit that converts a DC voltage to an AC voltage are placed on the element mounting surface.

9. The switching element unit according to claim 8, wherein
the dielectric portion is made of a ceramic material.

10. The switching element unit according to claim 1, further comprising:
a diode element that is electrically connected in parallel to the switching element, wherein
the diode element is placed on the element mounting surface.

11. The switching element unit according to claim 10, wherein
the opposing mounting surface facing the element mounting surface of the switching element is a first opposing mounting surface,
the diode element includes on a second opposing mounting surface facing the element mounting surface a terminal that is electrically connected to the capacitor connection electrode, and
the diode element is placed on the element mounting surface so that the second opposing mounting surface contacts the element mounting surface directly or via a bonding member.

12. The switching element unit according to claim 1, wherein
two of the switching elements that are electrically connected in series to each other to form a switching element series circuit are placed on the element mounting surface, and
a first capacitor connection electrode that electrically connects a first end of the switching element series circuit and a first terminal of the smoothing capacitor, a second capacitor connection electrode that electrically connects a second end of the switching element series circuit and a second terminal of the smoothing capacitor, and an inter-element connection electrode that electrically connects the two switching elements are formed on the element mounting surface.

13. The switching element unit according to claim 12, wherein
the inter-element connection electrode is placed between the first capacitor connection electrode and the second capacitor connection electrode in an extending direction of the element mounting surface.

14. The switching element unit according to claim 12, wherein
of the two switching elements forming the switching element series circuit, the switching element that is placed on a first end side is a first switching element, and the switching element that is placed on a second end side is a second switching element,
the switching element unit further comprises:
a first connection member that electrically connects the first capacitor connection electrode and the first switching element: and a second connection member that electrically connects the inter-element connection electrode and the second switching element,
the first connection member has a first portion that contacts the first capacitor connection electrode directly or via a bonding member, and a second portion that contacts the first switching element directly or via a bonding member, and the second connection member has a first portion that contacts the inter-element connection electrode directly or via a bonding member, and a second portion that contacts the second switching element directly or via a bonding member.

15. The switching element unit according to claim 1, wherein
six of the switching elements forming a DC-AC conversion circuit that converts a DC voltage to an AC voltage are placed on the element mounting surface.

16. The switching element unit according to claim 1, wherein
the dielectric portion is made of a ceramic material.

\* \* \* \* \*